US007907445B2

(12) United States Patent
Huang et al.

(10) Patent No.: US 7,907,445 B2

(45) Date of Patent: Mar. 15, 2011

(54) METHOD AND SYSTEM FOR OBTAINING A REFERENCE BLOCK FOR A MLC FLASH MEMORY

(75) Inventors: Chien-Fu Huang, Hsinchu (TW); Ming-Hung Chou, Hsinchu (TW); Han-Lung Huang, Hsinchu (TW); Shih-Keng Cho, Hsinchu (TW)

(73) Assignee: Skymedi Corporation, Hsinchu (TW)

( * ) Notice: Subject to any disclaimer, the term of this patent is extended or adjusted under 35 U.S.C. 154(b) by 148 days.

(21) Appl. No.: 12/486,691

(22) Filed: Jun. 17, 2009

(65) Prior Publication Data

US 2010/0321997 A1 Dec. 23, 2010

(51) Int. Cl.
*G11C 16/04* (2006.01)
*G11C 16/06* (2006.01)

(52) U.S. Cl. .............................. 365/185.03; 365/185.11

(58) Field of Classification Search ............. 365/185.03, 365/185.11, 185.2
See application file for complete search history.

(56) References Cited

U.S. PATENT DOCUMENTS 7,386,655 B2 * 6/2008 Gorobets et al. .............. 711/103
7,564,718 B2 * 7/2009 Seidel et al. ............. 365/185.28
2008/0037328 A1 * 2/2008 Toda ........................ 365/185.21
2008/0263266 A1 10/2008 Sharon et al.

FOREIGN PATENT DOCUMENTS

WO WO 2008/111058 9/2008

* cited by examiner

*Primary Examiner* — Anh Phung
(74) *Attorney, Agent, or Firm* — Squire, Sanders & Dempsey (US) LLP

(57) ABSTRACT

A method and system for obtaining a reference block on which reference voltages may be found for a MLC flash memory are disclosed. A first block and a second block are provided in the flash memory. A memory controller alternatively controls one of the first and the second blocks to act as the reference block and the other one as a cycle block in a respective period, during which the reference block stays idle and the cycle block is subjected to program/erase cycles.

14 Claims, 5 Drawing Sheets

| period | target cycling number | block A | block B |
|---|---|---|---|
| I | 100 | reference | cycle |
| II | 200 | cycle | reference |
| III | 300 | reference | cycle |
| IV | 400 | cycle | reference |
| ... | ... | ... | ... |

METHOD AND SYSTEM FOR OBTAINING A REFERENCE BLOCK FOR A MLC FLASH MEMORY

This application is related to the earlier U.S. patent application Ser. No. 12/464,240 filed May 12, 2009, which is incorporated by reference, without a claim of priority.

BACKGROUND OF THE INVENTION

1. Field of the Invention

The present invention generally relates to multi-level cell (MLC) flash memory, and more particularly to a method and system for obtaining a reference block in order to find the reference voltages for reading data from the MLC flash memory concerning both the cycle issue and retention issue.

2. Description of the Prior Art

Flash memory is a non-volatile solid state memory device that can be electrically erased and reprogrammed, and is a specific type of electrically erasable programmable read-only memory (EEPROM) device. Conventional flash memory stores a single bit of information in each memory cell such that each memory cell can be programmed to assume two possible states. The conventional flash memory is thus commonly referred to as single-level cell (SLC) flash memory or single-bit cell (SBC) flash memory. Modern flash memory is capable of storing two or more bits of information in each memory cell such that each memory cell can be programmed to assume more than two possible states. The modern flash memory is thus commonly referred to as multi-level cell (MLC) flash memory or multi-bit cell (MBC) flash memory.

In the MLC flash memory, data of different state are written to the flash memory (which is commonly referred as programming the flash memory) by storing different amount of charge in the floating gate of the flash memory. As the charge in the floating gate specifically determines the corresponding threshold voltage, the data can then be read from the MLC flash memory according to their different threshold voltage. Due to variations among the memory cells during the manufacture, operation or according to other factors, the threshold voltage of each state is not a constant value but a range. FIG. 1 shows a common distribution of the threshold voltage for a typical MLC flash memory (a three-bit cell flash memory is exemplified here). The entire voltage range (e.g., $V_{min}$ through $V_{max}$) is divided into a number of regions (e.g., eight regions in the example), each region corresponding to one state. The number of cells of each threshold voltage is collected as illustrated. When the flash memory is being read, the threshold voltage of a cell is compared to reference voltages (e.g., $V_1$, $V_2$, etc. in the figure) to determine its state. For example, if the threshold voltage of a cell is within the reference voltages $V_4$ and $V_5$, the "011" state is thus determined and read from the flash memory.

The reference voltages for reading data from the traditional MLC flash memory are constant. In practice, however, the threshold voltage distribution (e.g., the distribution in FIG. 1) may probably change after the flash memory has been subjected to a predetermined number of program/erase cycles or/and a predetermined data retention time has elapsed. For example, as shown in FIG. 2 (in which only two states are concerned and shown for illustrative purpose), the initial distribution represented by the (dotted) curve 20 with reference voltage $V_4$ may be suffered from retention issue after a long time not going through program/erase cycle, and therefore drifted downward to a shifted distribution represented by the (solid) curve 22 with a new reference voltage $V_4'$. Similarly, the initial distribution 20 may drift downward to a shifted distribution due to the (program/erase) cycle issue. In either case, errors probably incur if the reference voltage $V_4$ of the initial distribution 20 is still used (while the new reference voltage $V_4'$ is unknown) to read data from the flash memory.

Although conventional techniques provide some schemes for finding the reference voltages, those techniques, however, cannot properly find the reference voltages concerning both the cycle and retention issues. Accordingly, a need has arisen to propose some novel schemes to obtain a proper reference basis on which the reference voltages for reading data from the MLC flash memory may be properly found concerning both the cycle issue and the retention issue.

SUMMARY OF THE INVENTION

In view of the foregoing, it is an object of the present invention to provide system and method for obtaining a reference block in order to find the reference voltages for reading data from the MLC flash memory concerning both the cycle issue and retention issue.

According to one embodiment, a first block and a second block are provided in the flash memory. A memory controller alternatively controls one of the first and the second blocks to act as the reference block and the other one as a cycle block in a respective period, during which the reference block stays idle and the cycle block is subjected to program/erase cycles. In one embodiment, the reference voltages for reading data from the flash memory are found based on the reference block obtained in the respective period. The cycle block stops cycling whenever a predetermined target cycling number has been reached. The stopping cycle block waits until a wear-leveling mean exceeds the target cycling number, followed by changing roles of the first block and the second block.

DETAILED DESCRIPTION OF THE INVENTION

Figure 1:
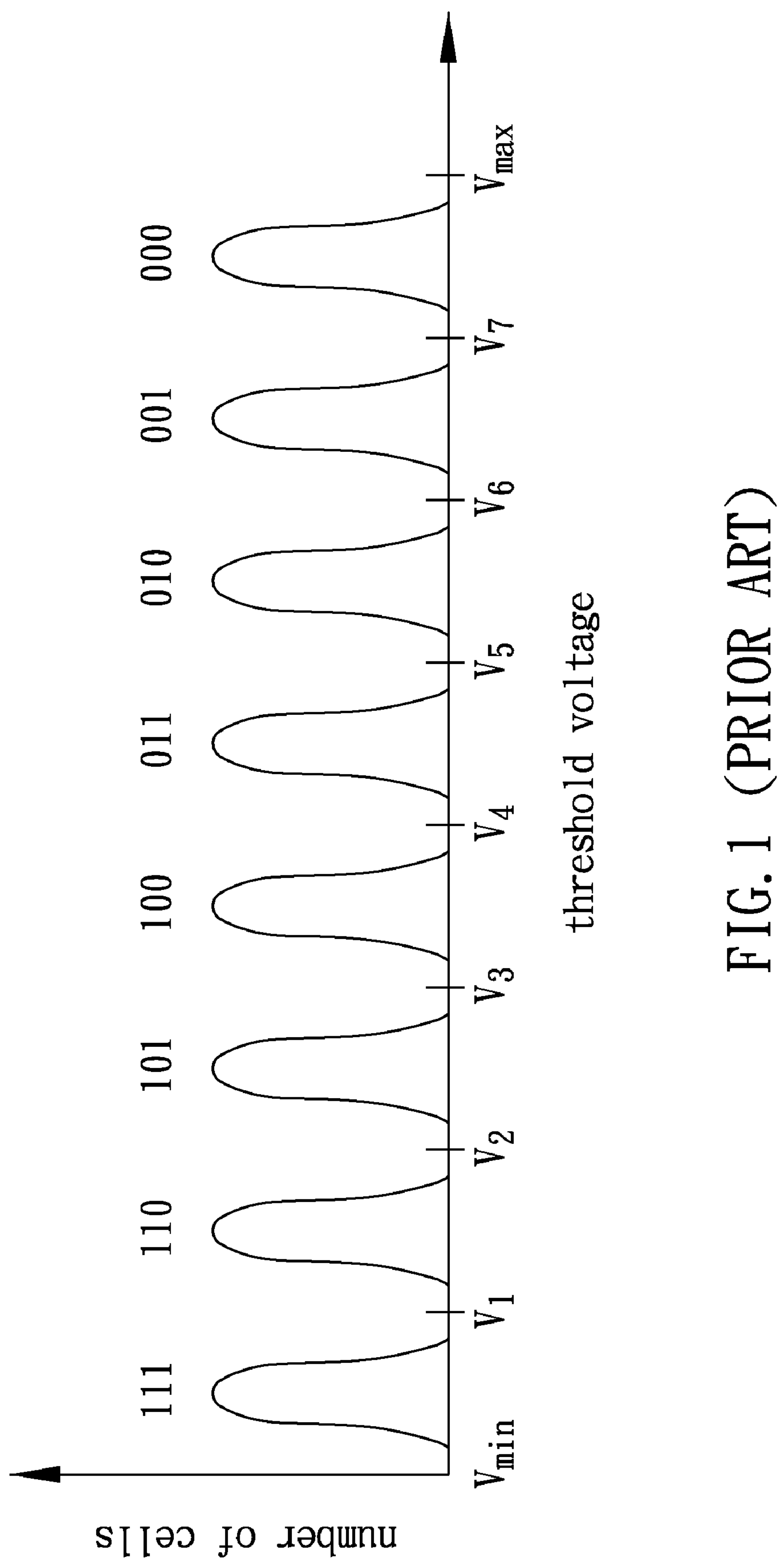
FIG. 1 shows a common distribution of the threshold voltage for a typical MLC flash memory.
Figure 2:
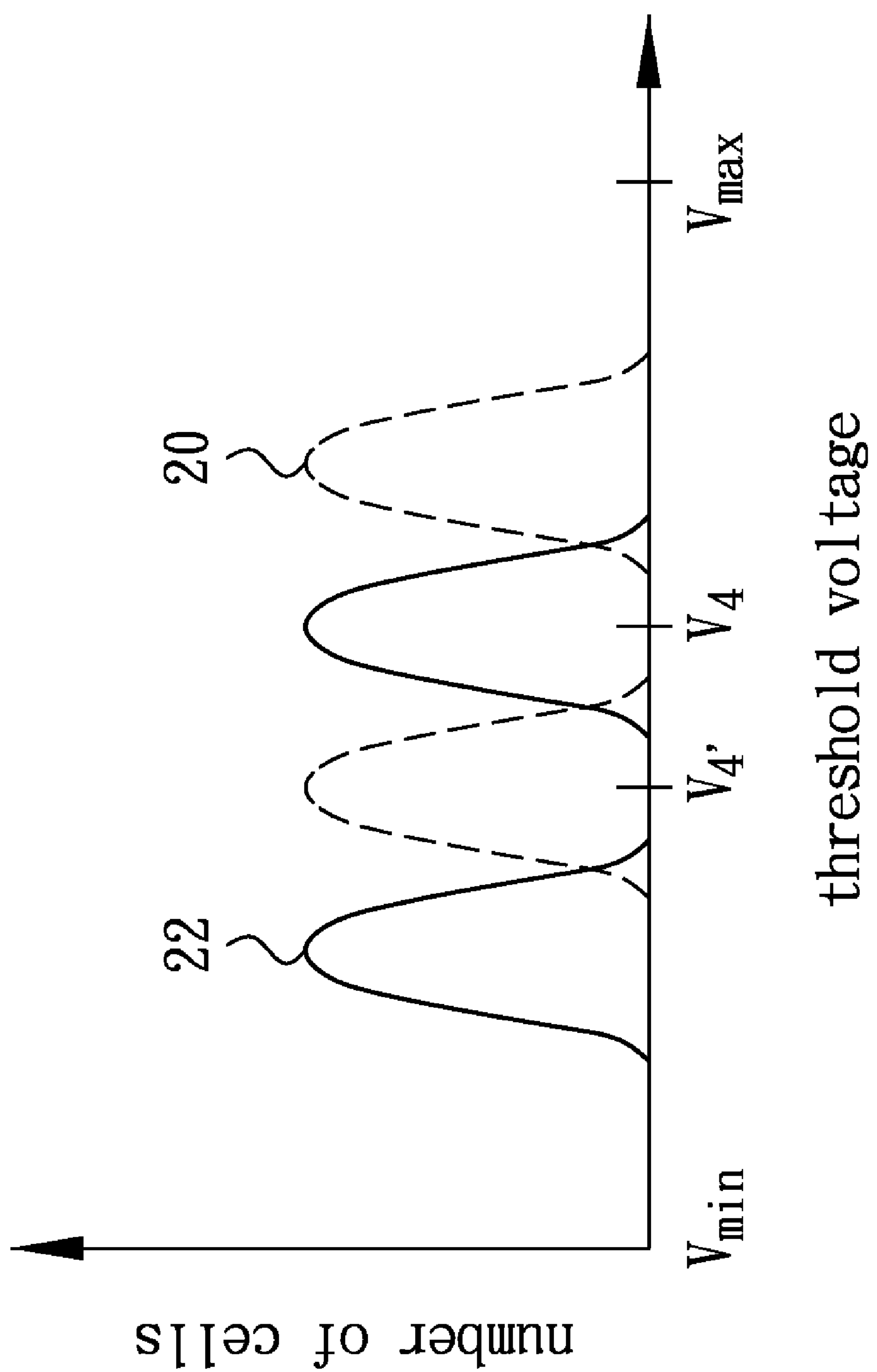
FIG. 2 shows that a portion of the threshold voltage distribution in FIG. 1 changes after the flash memory has been subjected to program/erase cycles or/and data retention time has elapsed.
Figure 3:
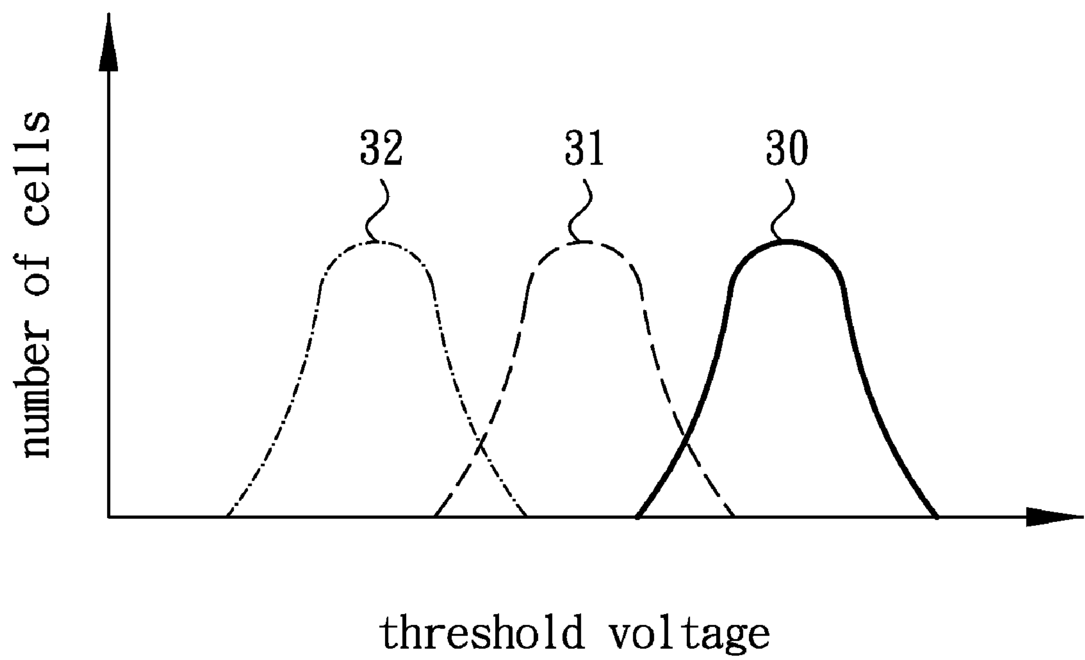
FIG. 3 shows exemplary drifted threshold voltage distributions along with initial distribution.

As discussed in the background of the invention, the reference voltages for reading data from the MLC flash memory may be affected by two variables—the number of (program/erase) cycles and the retention time. FIG. 3 shows exemplary drifted threshold voltage distributions 31 and 32 with initial distribution 30. In the figure, the curve 31 represents, for example, the threshold voltage distribution associated with the initial distribution 30 after the flash memory has been subjected to one hundred cycles with one-year retention, and the curve 32 represents, for example, the threshold voltage distribution associated with initial distribution 30 after the flash memory has been subjected to one thousand cycles with one-year retention. Accordingly, the determination of the reference voltages due to the retention issue also depends on how many cycles to which the flash memory has been subjected.

Figure 4:
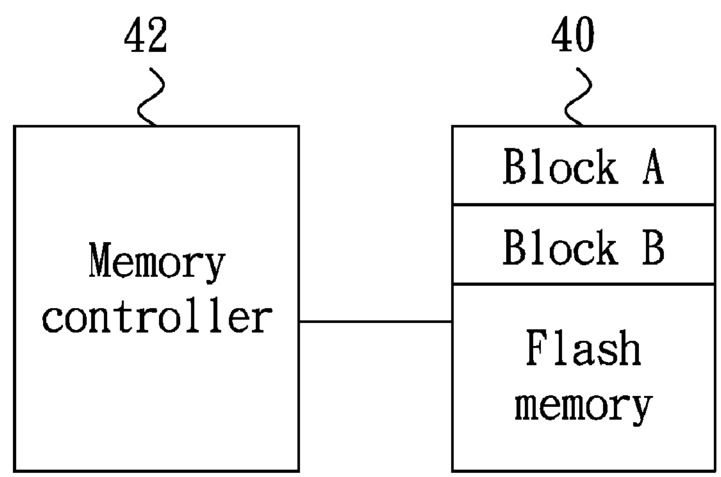
FIG. 4 shows a MLC flash memory in which two blocks are set aside for adaptively determining a reference block concerning both the retention issue and the cycle issue according to one embodiment of the present invention.

In order to adaptively determine the reference voltages concerning both the retention issue and the cycle issue, one embodiment of the present invention provides a scheme in which at least a first block ("the block A") and a second block ("the block B") are set aside in a MLC flash memory 40, which is controlled under a memory controller 42, as shown in FIG. 4. Although two blocks, i.e., the block A and the block B, are used in this embodiment, it is appreciated by those skilled in the art that more than two blocks may be well used. Under the control of the memory controller 42, the block A and the block B alternatively acts as a reference block in turn for determining the reference voltages for reading data from the MLC flash memory 40. While one of the blocks, e.g., the block A, currently acts as the "reference block (or unduty block)" which stays idle, the other block, e.g., the block B, acts as the "cycle block (or duty block)" which is subjected to program/erase cycles during the same period of time. In the next period of time, the block A changes its role to be the cycle block, and the block B to be the reference block. The successive alternation between the block A and the block B described above may be continuously followed.

Figures 5A, 5B:
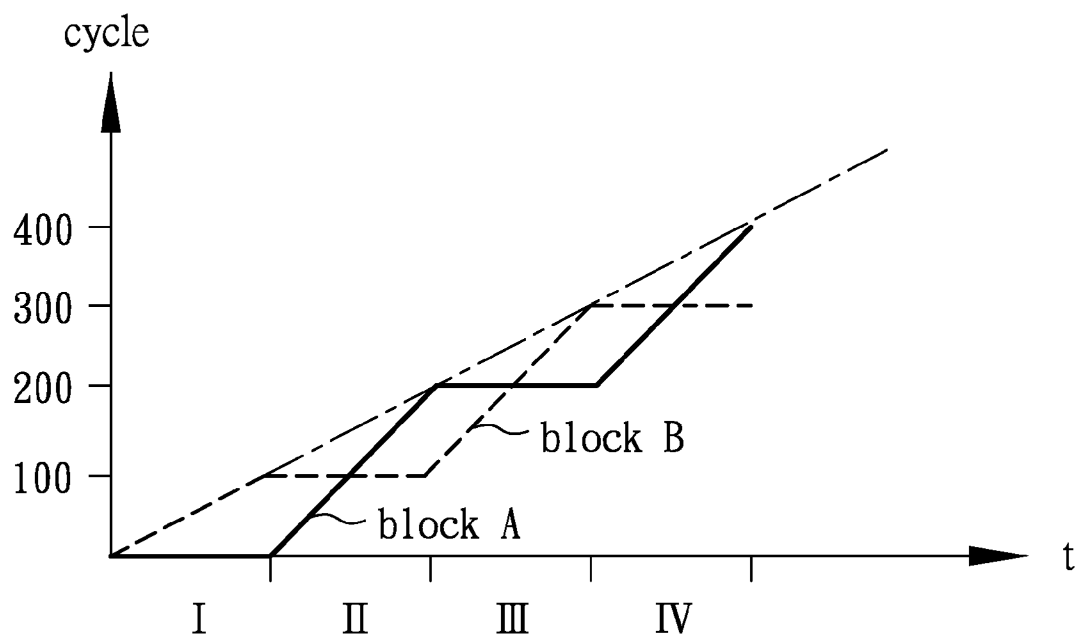
FIG. 5A shows exemplary reference/cycle blocks alternating between the block A and the block B.
FIG. 5B shows the number of cycles of the blocks during respective periods in FIG. 5A.

FIG. 5A shows exemplary reference/cycle blocks alternating between the block A and the block B, and FIG. 5B shows the number of cycles of the blocks during respective periods. Specifically, in the first period of time (I), the block A stays idle to act as the reference block, while the block B is subjected to cycles to act as the cycle block. Particularly, the number of cycles to which the block B is subjected is toward a target number of cycles, or the target cycling number, e.g., 100 cycles. The target cycling number is a predetermined number. In the embodiment, the block A and the block B change their (reference/cycle) roles according to the target cycling number and a wear-leveling mean. Specifically, the cycle block stops cycling whenever the target cycling number has been reached. Subsequently, the cycle block waits until the wear-leveling mean reaches the target cycling number, at that time, the blocks change their roles. The wear leveling is a well known technique commonly used in storage medium, such as flash memory, for prolonging the life of the storage medium. The operation of the wear leveling is done by specifically arranging data to be accessed such that the cells under (program/erase) cycles are evenly distributed (or evenly worn) within the storage medium. In other words, the entire storage medium, such as the flash memory, may approximately arrive at an average number of cycles through the wear leveling.

Subsequently, in the next (second) period of time (II), the block A now is subjected to cycles to act as the cycle block, while the block B now acts as the reference block. In this period, the number of cycles to which the block A is subjected is toward another target cycling number, e.g., 200.

According to the embodiment described above, a possible maximum threshold voltage shift of the flash memory may be obtained. The reference voltages for reading data from the MLC flash memory may then be obtained, by the memory controller 42, based on the obtained reference block during respective period of time. Conventional or modern technique (s) may be utilized to find the reference voltages based on the reference block obtained above. For example, the same applicant discloses some system/method for adaptively finding the reference voltages in an U.S. patent application Ser. No. 12/464,240 filed May 12, 2009, entitled "Reference Voltages for Reading Data from a MLC Flash Memory," the disclosures of which are hereby incorporated by reference.

Figure 6:
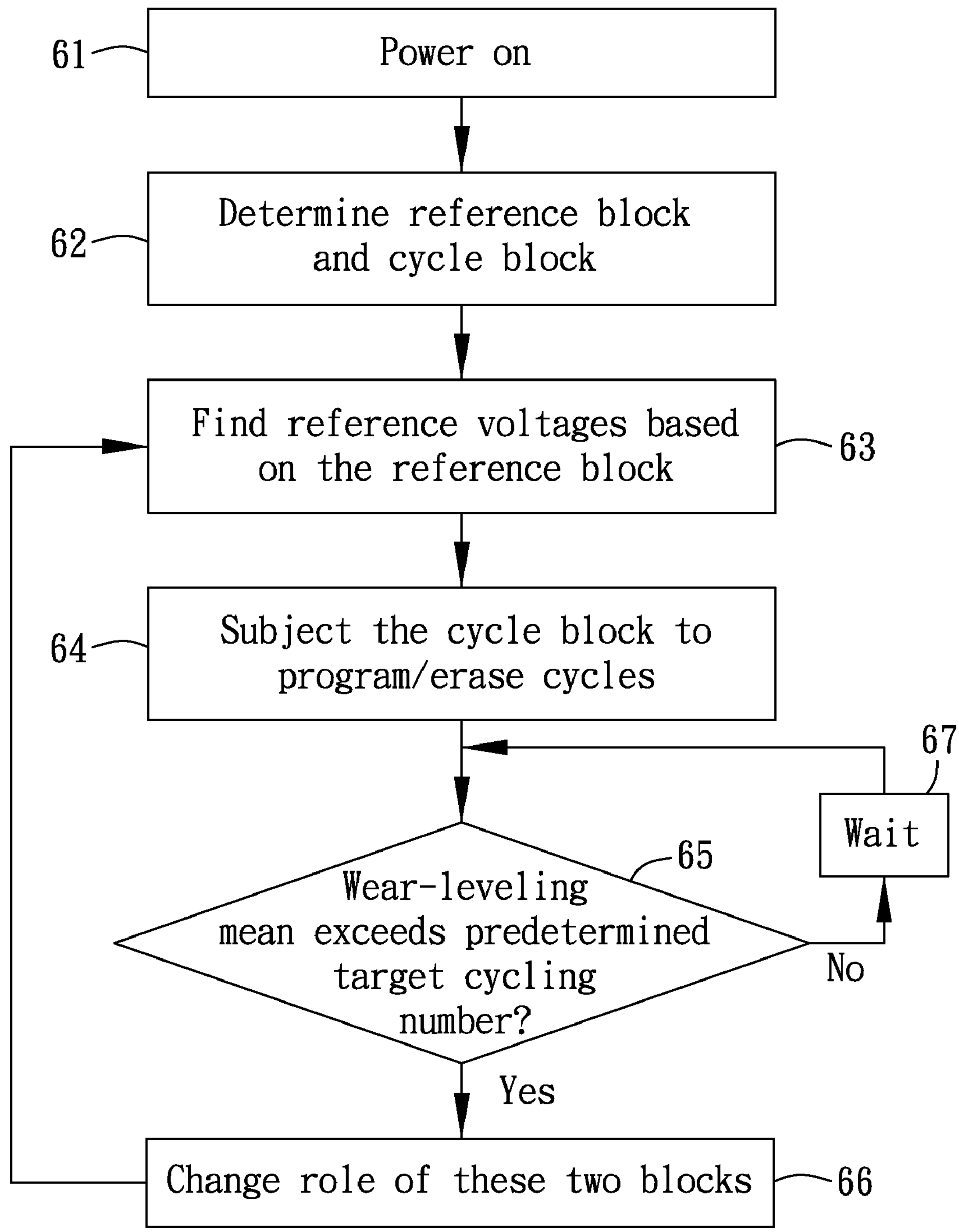
FIG. 6 shows a flow diagram illustrating the steps of controlling the block A and the block B in a flash memory (FIG. 4) according to one embodiment of the present invention.

FIG. 6 shows a flow diagram illustrating the steps of controlling the block A and the block B in a flash memory 40 (FIG. 4) according to one embodiment of the present invention. At the beginning, when power is applied to the flash memory 40 (the step 61), a check is made to determine which one of these blocks is used as a reference block (and the other one is used as a cycle block) in the step 62. Based on the result of the determination, reference voltages are found, in the step 63, based on the determined reference block using conventional or modern technique such as that disclosed in an U.S. patent application Ser. No. 12/464,240 filed May 12, 2009, entitled "Reference Voltages for Reading Data from a MLC Flash Memory" by the same applicant. According to the embodiment, finding the reference voltages in the power-on period advantageously incurs no extra time penalty on read latency. Afterwards, in the step 64, the cycle block is subjected to program/erase cycles. The cycle block stops cycling whenever the predetermined target cycling number has been reached. The cycle block then waits (the step 67) without further cycling until the wear-leveling mean exceeds the predetermined target cycling number (the "Yes" branch of the step 65). At that time, the reference block and the cycle block change their roles in the step 66, followed by the performance of the step 63 (i.e., finding the reference voltages based on the reference block).

Although specific embodiments have been illustrated and described, it will be appreciated by those skilled in the art that various modifications may be made without departing from the scope of the present invention, which is intended to be limited solely by the appended claims.

What is claimed is:

1. A method for obtaining a reference block on which reference voltages are found for a MLC flash memory, comprising:

providing a first block and a second block in the flash memory; and alternatively controlling one of the first and the second blocks to act as the reference block and the other one as a cycle block in a respective period;

wherein the reference block stays idle and the cycle block is subjected to program/erase cycles during the respective period.

2. The method of claim 1, wherein the first block acts as the reference block and the second block acts as the cycle block in a first period, and, alternatively, the first block acts as the cycle block and the second block acts as the reference block in a subsequent second period.

3. The method of claim 2, further comprising a step of finding the reference voltages for reading data from the flash memory based on the reference block in the respective period.

4. The method of claim 3, wherein the step of finding the reference voltages is performed during a power-on period or after the first block and the second block change their roles for said subsequent second period.

5. The method of claim 2, wherein number of cycles to which the cycle block is subjected is toward a predetermined target cycling number in the respective period.

6. The method of claim 5, wherein the cycle block stops cycling whenever the predetermined target cycling number has been reached.

7. The method of claim 6, wherein the stopping cycle block waits until a wear-leveling mean exceeds the target cycling number, followed by changing roles of the first block and the second block for said subsequent second period.

8. A system for obtaining a reference block on which reference voltages are found for a MLC flash memory, comprising:

a first block and a second block provided in the flash memory; and a memory controller for alternatively controlling one of the first and the second blocks to act as the reference block and the other one as a cycle block in a respective period;

wherein the reference block stays idle and the cycle block is subjected to program/erase cycles during the respective period.

9. The system of claim 8, wherein the first block acts as the reference block and the second block acts as the cycle block in a first period, and, alternatively, the first block acts as the cycle block and the second block acts as the reference block in a subsequent second period.

10. The system of claim 9, wherein the controller further finds the reference voltages for reading data from the flash memory based on the reference block in the respective period.

11. The system of claim 10, wherein the memory controller performs to find the reference voltages during a power-on period or after the first block and the second block change their roles for said subsequent second period.

12. The system of claim 9, wherein number of cycles to which the cycle block is subjected is toward a predetermined target cycling number in the respective period.

13. The system of claim 12, wherein the cycle block stops cycling whenever the predetermined target cycling number has been reached.

14. The system of claim 13, wherein the stopping cycle block waits until a wear-leveling mean exceeds the target cycling number, followed by changing roles of the first block and the second block for said subsequent second period.

* * * * *